United States Patent [19]
Holt et al.

[11] Patent Number: 5,412,587
[45] Date of Patent: May 2, 1995

[54] PSEUDORANDOM STOCHASTIC DATA PROCESSING

[75] Inventors: Frederick B. Holt, Seattle; Dziem D. Nguyen, Redmond, all of Wash.

[73] Assignee: The Boeing Company, Seattle, Wash.

[21] Appl. No.: 291,655

[22] Filed: Dec. 28, 1988

[51] Int. Cl.⁶ .............................................. G06F 1/02
[52] U.S. Cl. .................................................. 364/717
[58] Field of Search ....................... 364/700, 717, 717.5

[56] References Cited

U.S. PATENT DOCUMENTS

| | | | |
|---|---|---|---|
| 3,612,845 | 10/1971 | Lawlor | 364/701 |
| 3,614,400 | 10/1971 | Farnett | 364/717 |
| 3,746,847 | 7/1973 | Maritsas | 364/717 |
| 3,881,099 | 4/1975 | Ailett et al. | 364/717 |
| 3,999,181 | 12/1976 | Hirsch | 340/146.2 |
| 4,115,867 | 9/1978 | Vladimirov et al. | 364/900 |
| 4,200,935 | 4/1980 | Hoffmann et al. | 364/717 |
| 4,219,877 | 8/1980 | Vladimirov et al. | 364/900 |
| 4,649,419 | 3/1987 | Arragon et al. | 380/20 |

OTHER PUBLICATIONS

Ribeiro, S., "Random-Pulse Machines", *IEEE Transaction on Electronic Computers*, vol. EC-10, No. 3, (Jun. 1967).
Poppelbaum et al., "Stochastic Computing Elements and Systems", *Fall Joint Computer Conference*, pp. 635-644 (1967).
Gaines, B. R., "Stochastic computer thrives on noise", *Electronics*, p. 72 (Jul. 10, 1967).
Nguyen and Holt, "Stochastic Processing in a Neural Network Application", *IEEE First International Conference on Neural Networks*, vol. III, (Jun. 1987).
Gupta & Kumaresan, "Stochastic and Deterministric Computing", 20 Annual Conf. on Signals, Systems and Computers, Asilomar, Calif., (Nov. 10-12, 1986).
Van den Bout & Miller, "A Stochastic Architecture for Neural Nets", *Proc. of ICNN '88*, vol. I, pp. 481 et seq. (1988).
Horowitz and Hill, *The Art of Electronics*, The Cambridge University Press pp. 438-440, (1980).

Primary Examiner—Thomas C. Lee
Attorney, Agent, or Firm—Christensen O'Connor Johnson & Kindness

[57] ABSTRACT

A stochastic data processing technique in which a conversion signal is generated representing a pseudorandom sequence of numbers. The conversion signal is then used to convert input signals representing a pair of input operands into respective first and second stochastic signals. The same conversion signal is used to encode both operands. A primitive data processing operation is then performed on the first and second stochastic signals to produce an output signal that may be converted back into nonstochastic form. The primitive data processing operations include MAX, MIN, absolute difference, arithmetic mean and multiplication. For multiplication, one of the stochastic signals is subjected to a predetermined delay.

8 Claims, 4 Drawing Sheets

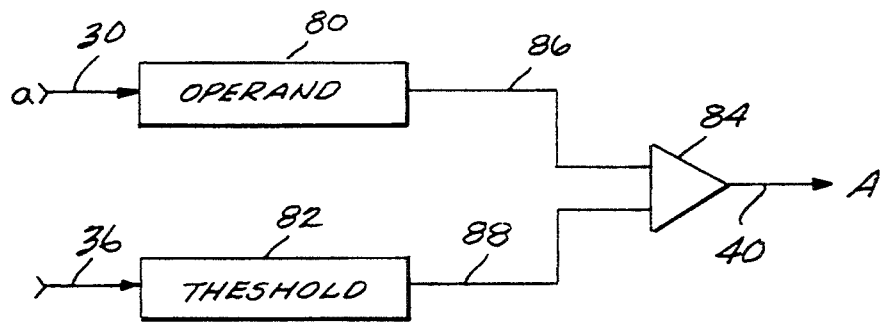
Fig. 3.
| THESHOLD VALUES | OPERAND = 5/7 | OUTPUT VALUE | OPERAND = 1/4 | OUTPUT VALUES |
|---|---|---|---|---|
| .100 | .10110... | 1 | .01 | 0 |
| .010 | .10110... | 1 | .01 | 1 |
| .101 | .10110... | 1 | .01 | 0 |
| .110 | .10100... | 0 | .01 | 0 |
| .111 | .10100... | 0 | .01 | 0 |
| .011 | .10100... | 1 | .01 | 0 |
| .001 | .10100... | 1 | .01 | 1 |
Fig. 4.
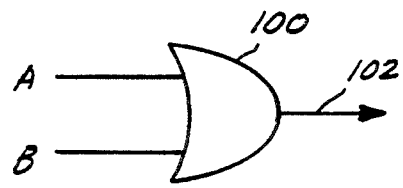
Fig. 5.
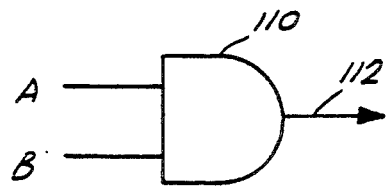
Fig. 6.
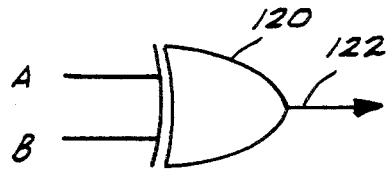
Fig. 7.

PSEUDORANDOM STOCHASTIC DATA PROCESSING

FIELD OF THE INVENTION

The present invention relates to data processing and, in particular, to stochastic data processing in which signals are converted into stochastic form using pseudorandom numbers.

BACKGROUND OF THE INVENTION

Stochastic processing is an alternative to conventional digital or analog processing for performing primitive data processing operations. In a stochastic processing system, each operand is represented by a binary value sequence, i.e., a sequence of 1's and 0's. Conversion of an operand into stochastic form can be performed by first scaling the operand such that it lies in the range between 0 and 1, and by then converting the operand into a sequence of binary values (1's and 0's) such that in a given sequence of sufficient length, the ratio of the number of 1 values in the sequence to the total number of values in the sequence is equal to the scaled operand.

The conversion of an operand into its stochastic representation is carried out by comparing the operand to a sequence of random numbers that also lie in the range between 0 and 1. Whenever the operand exceeds the random number, a 1 value is inserted into the output sequence. When the operand is less than the random number, a 0 value is inserted into the output sequence.

An important advantage of stochastic processing is that some primitive data processing operations (e.g., multiplication and addition) can be performed with extremely simple hardware, often with a single logic gate. The disadvantage of stochastic processing is that relatively long processing times are required, since the stochastic representations are generated and processed in serial form.

The initial approach to stochastic processing relied on natural random noise, such as a signal from a noisy diode, to produce the random number sequences. However, it was generally found that excessive time intervals were required in order to obtain a stochastic representation that was true to the value of the operand. Furthermore, with a truly random sequence, the representation of an operand varies from one encoding to the next, precisely because the noise is truly random. The correspondence between an operand and its stochastic representation is best when the noise is uniformly distributed, which is not true of natural random noise, particularly in a finite time sample. Further, for an operation such as multiplication that requires two input operands, the two random number sequences must be independent for accurate results. However, the independence requirement cannot be guaranteed for natural noise.

For the above reasons, it has generally been found that for representations of moderate length, stochastic processing using natural random noise performs inconsistently and inaccurately. Furthermore, it is not possible to use random stochastic processing to perform many useful data processing operations, such as finding the maximum of two input operands. For this reason, stochastic processing using random noise sources has not developed any practical applications.

More recently, various investigations have been made into the use of pseudorandom noise in stochastic processing. A pseudorandom number sequence has approximately the same statistics as a random sequence, but is deterministic. The use of pseudorandom sequences has significantly increased the accuracy of stochastic multiplication. However, in prior techniques of this type, the multiplication has incompatible front and back ends, i.e., two four-bit operands have an eight-bit product. Furthermore, the available primitive data processing operations have been limited to multiplication, weighted addition, and complement.

SUMMARY OF THE INVENTION

The present invention provides a method and apparatus for using stochastic techniques to perform primitive data processing operations. To perform such operations, the invention compares two operands against a common pseudorandom number sequence, to encode the operands into their stochastic representations. As a result, in comparison to prior stochastic techniques, the available primitive data processing operations are greatly expanded, the accuracy of the operations is increased, and the operations are deterministic and repeatable.

In a preferred embodiment, a method according to the present invention comprises the steps of generating a conversion signal representing a pseudorandom sequence of numbers, and then using the conversion signal to convert first and second input signals into respective first and second stochastic signals. A primitive data processing operation is then performed on the first and second stochastic signals to produce an output signal. The output signal may be used in a subsequent data processing operation, or may be converted into nonstochastic form. Primitive data processing operations described using this technique include a maximum operation, a minimum operation, an absolute difference operation, an arithmetic mean operation and a multiplication operation. Each operation may be carried by means of a single logic gate.

BRIEF DESCRIPTION OF THE DRAWINGS

FIG. 3 illustrates the process of encoding numbers into stochastic representations;

FIG. 4 is a table illustrating the coding of two operands into stochastic representations;

FIG. 5 illustrates implementation of the maximum operation in accordance with the present invention;

FIG. 6 illustrates implementation of the minimum operation in accordance with the present invention;

FIG. 7 illustrates implementation of the the absolute difference operation in accordance with the present invention;

DETAILED DESCRIPTION OF THE INVENTION

Figure 1:
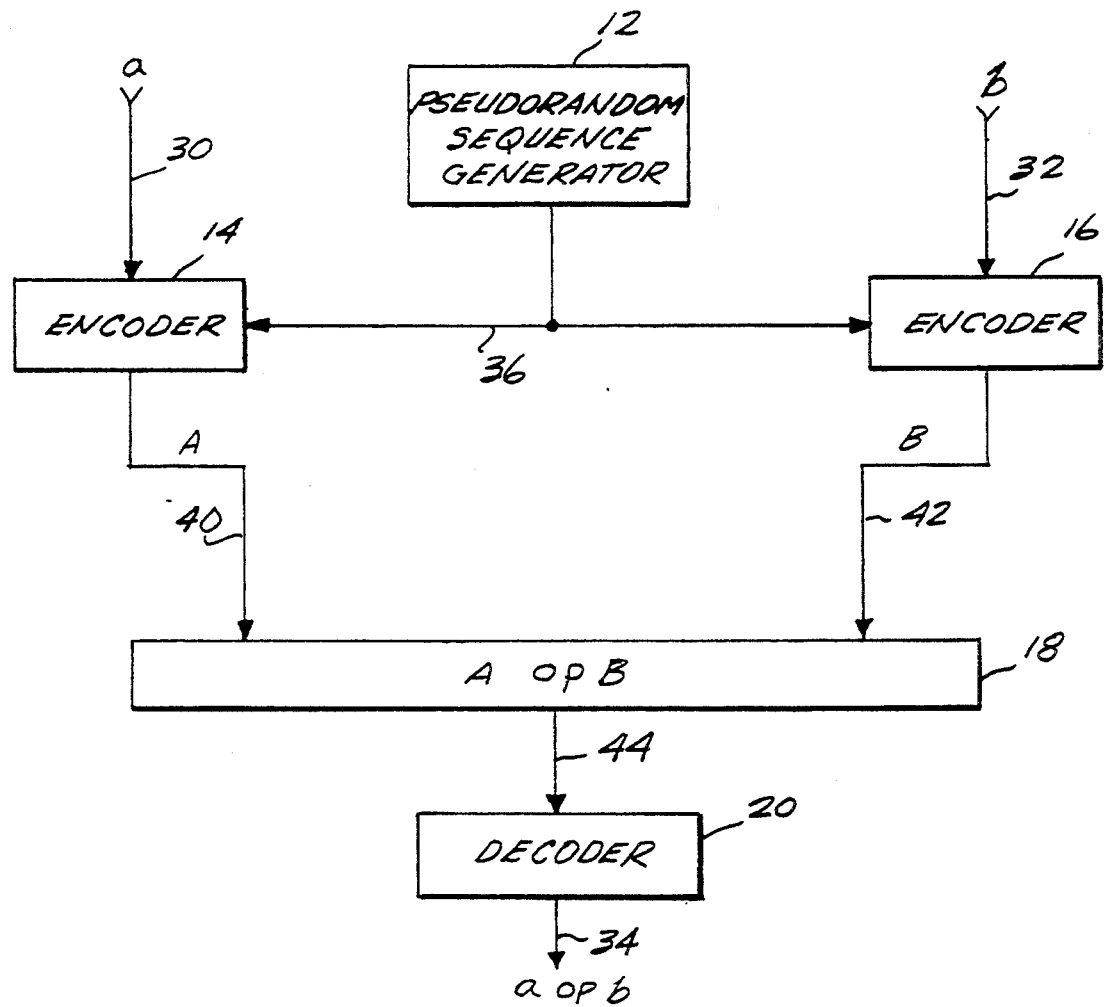
FIG. 1 is a block diagram of a stochastic processing system according to the present invention.

FIG. 1 illustrates a basic stochastic processing system and method according to the present invention. The system comprises pseudorandom sequence generator 12, encoders 14 and 16, logic unit 18 and decoder 20. The illustrated system receives a pair of digital or analog input signals on lines 30 and 32, the input signals representing the operands a and b, respectively. The system produces a digital or analog output signal representing the result a OP b on line 34, OP standing for a primitive data processing operation. For example, for the case in which OP stands for the multiplication operation, the output signal represents the product a . b.

Pseudorandom sequence generator 12 produces a conversion signal that represents a sequence of pseudorandom numbers, and provides the conversion signal to encoders 14 and 16 over line 36. Encoder 14 uses the conversion signal to convert the input signal on line 30, representing operand a, into a stochastic signal on line 44 representing the stochastic form of operand a, herein designated A. Similarly, encoder 16 uses the conversion signal on line 36 to convert the input signal on line 32, representing operand b, into a stochastic signal on line 42, representing the corresponding stochastic representation B. To simplify the following description, the symbols a, b, A, and B, etc., will hereafter be used to refer both to the signals, and to the operands represented by such signals. The stochastic signals A and B are input into logic cell 18, and the logic cell produces a stochastic signal representing A OP B on line 44. Decoder 20 averages this signal to produce its nonstochastic (e.g., digital or analog) equivalent on line 34. As described below, in certain cases the stochastic signal on line 44 may be used without conversion, to form one of the stochastic input signals for another operation.

Figure 2:
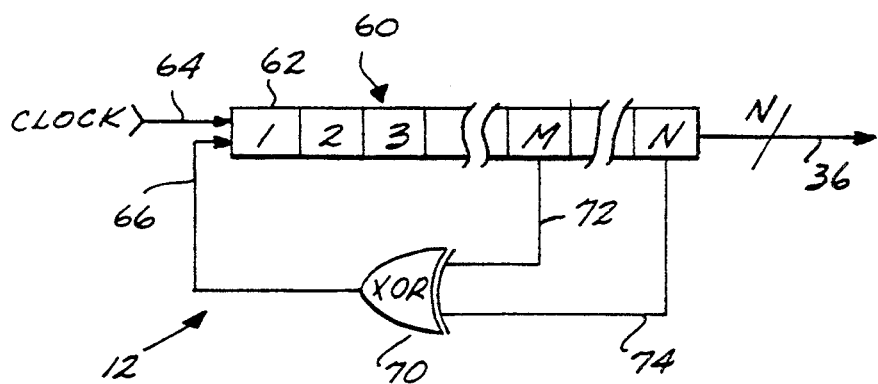
FIG. 2 illustrates use of a shift register to generate pseudorandom numbers.

Pseudorandom generator 12 may be implemented using feedback shift register sequences, as described in Horowitz, *The Art of Electronics*, p. 438. Referring to FIG. 2, such a pseudorandom number generator may comprise shift register 60, the shift register including N memory cells 62. In response to each cycle of a clock signal on line 64, shift register 60 shifts all data one memory cell to the right, shifts one bit of data from line 66 into its first cell, and shifts one bit of data out of cell N onto line 74. The signal on line 66 is produced by exclusive XOR gate 70 that has its inputs on lines 72 and 74 connected to receive bits N and M of the shift register. During each cycle of the clock signal, the contents of the shift register are output in parallel, to produce an N-bit word on lines 36. The sequence of N bit words on line 36 comprises the conversion signal. If the value M is suitably selected, then the shift register will go through a maximal length sequence in which the shift register assumes each of its $2^N-1$ possible non-zero states once before it repeats any state. The number $2^N-1$ will typically be used as the encoding length (RLEN), i.e., the number of serial bits in each stochastic representation. If each N-bit word appearing on line 36 is interpreted as a binary number, then such numbers will be uniformly distributed over the range from 1 to $2^N-1$. If the N-bit words on line 36 are interpreted as binary fractions, the numbers will be uniformly distributed between 0 and 1.

FIG. 3 illustrates the operation of each encoder, for example, encoder 14. The encoder comprises registers 80 and 82 and comparator 84. Register 80 receives and stores the signal on line 30 representing operand a. If necessary, means (not shown) are provided for converting the signal on line 30 to digital form, and for scaling the signal such that it is in the range of 0–1.

Register 82 receives the conversion signal from the pseudorandom sequence generator via line 36. Each N-bit binary word received on line 36 is stored in register 82, and this data will henceforth be referred to as the threshold. When the operand and threshold have been loaded into the respective registers, they are compared by comparator 84. If the operand is greater than or equal to the threshold, then the operand is represented by a 1 in the current time slot, i.e., a 1 bit is output on line 40. If the operand is less than the threshold, the operand is represented by a 0 in the current time slot, and a 0 bit is output on line 40. A new threshold value is then loaded via lines 36, a new comparison is made, and another 0 or 1 bit is output on line 40. This process continues for a total of RLEN iterations, at which point the coding of the operand is complete, and a new operand may be loaded into register 80. Thus the output produced by the encoder is a stochastic signal comprising a serial sequence of 1 and 0 bits, with the proportion of one bits being equal to operand a.

The above process may be clarified by the example shown in FIG. 4. In this example, a three-bit shift register is used for the pseudorandom sequence generator. There are seven possible nonzero states for a three-bit shift register, and a maximum length sequence of length 7 is shown in the left-hand column of FIG. 4. Decimal points have been included in column 1 to indicate that the threshold values may be interpreted as binary fractions. The second and third columns of FIG. 4 show the result of encoding the operand 5/7, which is equal to the binary fraction 0.10110 . . . , against the seven threshold values. The output value is one when the operand is greater than or equal to the threshold, and is zero when the operand is less than the threshold. The result is a stochastic signal 1110011 in which five out of the seven bits are one bits. The fourth and fifth columns of FIG. 4 show the result of encoding the operand 1/4 that is equal to binary fraction 0.01. In this case, the output sequence is 0100001, a stochastic signal having the value of 2/7, or 0.286.

Decoder 20 in FIG. 1 may comprise any means for averaging the stochastic signal on line 44 to produce a corresponding nonstochastic representation on line 34. For example, in a digital system, decoder 20 could simply comprise a counter for counting the number of 1 bits or pulses in RLEN time slots. For an analog system, decoder 20 could comprise means for producing an analog output signal having a level equal to the average level of the pulse train on line 44.

The pseudorandom encoding described above has several important characteristics. First, there is an inherent level of quantization introduced. If an eight-bit shift register is used, then every stochastic representation comprises a 255-bit binary word. Consequently, every operand is truncated to this level of quantization, i.e., the operands 1/2 and 257/512 are both represented by 128 1 values in 255 time slots. The bit streams resulting from most operations on these operands will have the same level of quantization. Thus the length of the encoding is directly related to the accuracy achievable in representations and operations. If three decimal places of accuracy are desired, then a shift register of length 10 could be used, yielding 1023 time slots per representation. This will represent operands to this quantization level, i.e., to within 1/1023 of the operand.

A second characteristic of stochastic representation is that it is tolerant of soft errors, since all the time slots (bits) are of equal weight. Misreading any time slot will cause an error of 1/RLEN, where RLEN is the length of the pseudorandom sequence used to encode the operands (e.g., RLEN=7 in the example of FIG. 4). This error is equal to the level of quantization, and no time slot is more or less significant.

A third feature of the described stochastic representation is that the noise generated by the shift register is uniformly distributed. The thresholds for comparison with the operand all have the same denominator, and every fraction with this denominator occurs as a threshold once, and only once, in each pass through the maximum length sequence. Moreover, this sequence is periodic, so that the representation given an operand once will be the same representation given when that operand recurs. The representations will therefore be repeatable and consistently accurate.

In accordance with the present invention, the deterministic nature of pseudorandom stochastic processing may be exploited to allow many more primitive data processing operations to be performed than in conventional stochastic processing, or in prior pseudorandom threshold processing. This is accomplished by comparing each of two operands a and b to an identical sequence of thresholds, i.e., to the same conversion signal, rather than against separate conversion signals, as in prior pseudorandom stochastic processing. Thus referring to FIG. 1, it will be noted that the same conversion signal is input to both encoders via line 36. Thus in each time slot, the two operands are compared to the same threshold value. The stochastic signals A and B are said to be in phase when they correspond in this way.

FIGS. 5-9 illustrate five primitive data processing operations that can be carried out by means of in phase, pseudorandom, stochastic processing. Referring to FIG. 5, the operation MAX (a,b), i.e., finding the maximum of two operands, is implemented by the single OR gate 100. Since A and B are in phase, a pulse (i.e., a 1 bit) will occur on output line 102 whenever either a or b is greater than or equal to the threshold for that time slot, and the greater of a and b will be the determining value for the comparison. A stochastic signal representing the value A or B, whichever is greater, will therefore be produced on line 102. The stochastic signal on line 102 will be in phase with A and B.

FIG. 6 illustrates that the MIN (a,b) operation, i.e., the finding of the minimum of two operands, can be carried out with a single AND gate 110. With A and B in phase, the AND gate will yield pulses in the time slots corresponding to thresholds less than both a and b, and the smaller of the two values will therefore determine the result. The stochastic signal on line 112 therefore represents A or B, whichever is smaller. So long as all operands remain in phase, the operations of MIN and MAX can be executed in parallel, i.e., cascaded pairwise in digital hardware. This feature will be of particular significance to applications such as image processing.

FIG. 7 illustrates that the operation ABS (a-b), i.e., finding the absolute value of the difference between two operands, can be implemented using a single exclusive XOR gate 120. The bit stream on output line 122 contains pulses only in those time slots in which only one of the values a and b exceeded the threshold. Thus a stochastic signal will be produced on line 122 representing the absolute value of the difference between a and b. For this operation, the output on line 102 is not in phase with input stochastic signals A and B.

Figure 8:
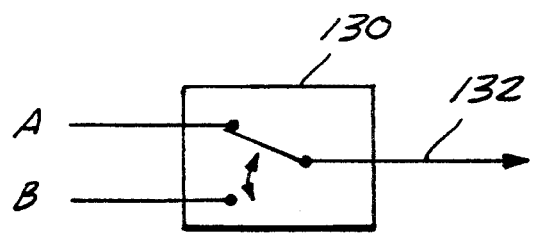
FIG. 8 illustrates implementation of the mean value operation in accordance with the present invention.

Referring to FIG. 8, a single switch 130 may be used to produce a stochastic signal on line 132 representing the arithmetic mean of a and b. Switch 130 couples either A or B to produce the output signal on line 132, depending on the switch position. If the position of the switch is changed after RLEN/2 time slots, then an in-phase signal will be produced on line 132 that approximates the arithmetic mean of a an b. This approximation can be made more exact if at least one operand is compared against the cycle of RLEN thresholds twice, e.g., by appending a duplicate of A to itself in time by providing two successive a operands on line 30 (FIG. 1). This representation, symbolized herein by A:A, is entirely compatible with all the operations described above and below, including discussions of representations being in phase. Using this approach, the position of switch 130 is changed from the B to the A position after the first RLEN bits and before the second RLEN bits. The switch will produce the output signal A:B on line 132. When averaged over 2.RLEN bits, this is the stochastic representation of (a+b)/2. Unless a and b are equal to one another, the bit stream on output line 132 is not in phase with A or B. Switch 130 can be implemented by an FET or any other suitable device.

Figure 9:
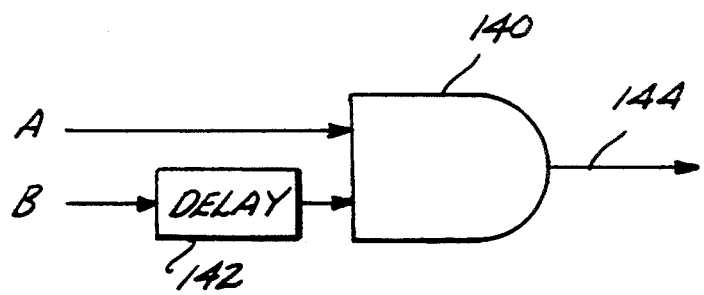
FIG. 9 illustrates implementation of the multiplication operation in accordance with the present invention.

The multiplication operation is carried out by the apparatus illustrated in FIG. 9, comprising AND gate 140 and delay circuit 142. Stochastic signal A is input directly to one input terminal of the AND gate, while a delayed version of the other stochastic signal B is input to the second input terminal. Thus the two stochastic signals A and B are offset by a fixed phase, i.e., by a fixed number of time slots with relation to one another. For each choice of RLEN, one may determine the delay that optimizes the accuracy of an approximate product between the two inputs. Such a choice can yield an average accuracy in the products slightly below the level of quantization, with the maximum product error being about four or five times the quantization level. For example, for N values of 255, 511, 1023 and 2047, suitable delays are 5, 6, 29 and 27 bits, respectively. It should be noted that for each RLEN value, there are other delays that give a lower average product error or a lower maximum product error. The delays listed above were chosen because they are indicative of the accuracy possible, and because the delays are fairly small. It should also be noted that the product bit stream on line 144 is not in phase with A or B.

It is possible to cascade many of the operations described above, provided care is taken to ensure the in phase characteristic of the operands for appropriate operations. Any number of MIN and MAX operations may be performed in parallel and cascaded, as long as all the operands are in phase initially. This provides a convenient way of comparing local extremes versus one another. Parallel results from any one other operation can also be cascaded with MIN and MAX. These two operations will perform accurately on the results of two absolute differences, provided that both absolute differences have the same maximum or minimum operand. The single gate operations of MIN and MAX require only that the operands be in phase with one another, regardless of their origin. These operations will perform as accurately on the two-bit streams leaving an absolute difference operation, under the conditions described above, as they will on two-bit streams provided directly from the encoders.

One of the most natural applications for pseudorandom threshold processing is in image processing. For example, when used for grey level image processing, the quantization level will be invariant. Thus if the image starts with 256 grey levels, scaled between 0 (black) and 1 (white), then every resultant image will also have 256 grey levels. In addition, only one interconnect is required to each pixel. The grey value for that pixel can be encoded time-wise along a single line, and thereafter all of the above operations can be performed with a single logic element. Operations which are global to the entire image can be performed in parallel, and the hardware for this is simple: one wire per pixel, one gate per operation. More complicated operations may be accomplished with fewer gates than in a digital signal processing equivalent.

Figure 10:
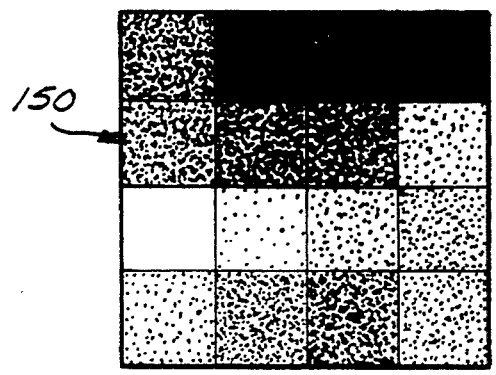
FIG. 10 illustrates a simple 4×4 image having eight grey levels.
Figure 11:
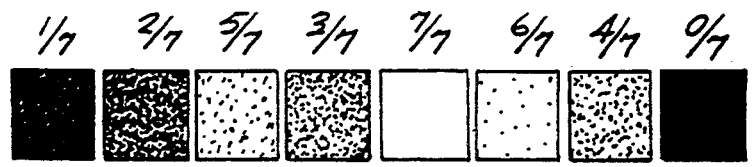
FIG. 11 illustrates a series of grey level thresholds produced by a length seven pseudorandom generator.
Figure 12:
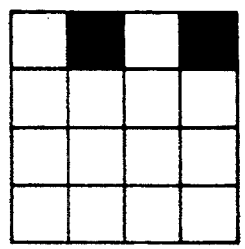
FIG. 12 illustrates encoding of the FIG. 10 image into a stochastic representation comprising seven 4×4 arrays.
Figure 12:
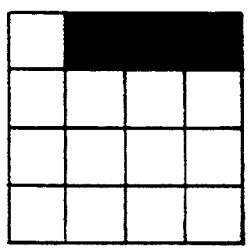
Figure 12:
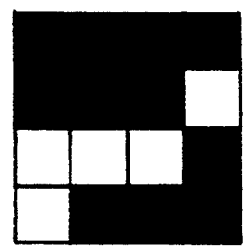
Figure 12:
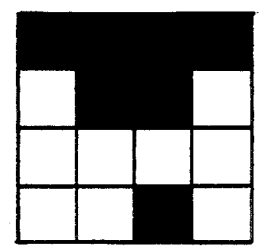
Figure 12:
Figure 12:
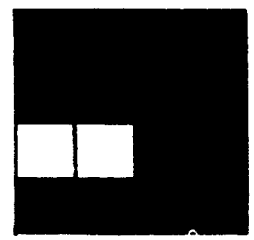
Figure 12:
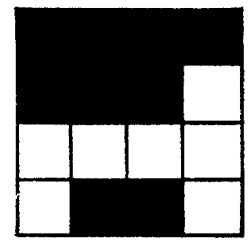

To apply the techniques set forth above to image processing, an image may be decomposed into RLEN binary frames. Suppose the image is a 4×4 array of pixels, with eight grey levels, as shown in FIGS. 10–12. FIG. 10 shows the original image. FIG. 11 represents the eight thresholds 0/7-7/7 corresponding to the thresholds shown in FIG. 4. Applying these thresholds to each image pixel, one obtains a stochastic representation comprising seven 4×4 frames, as shown in FIG. 11. Eight grey levels can be distinguished by seven frames, and the 0/7 threshold value, corresponding to black, never occurs. Instead, a black pixel is represented as no pulse for that pixel in every frame. This decomposition of a grey level image into binary frames allows the above operations to be implemented simply and in parallel. The number of grey levels is invariant due to the quantization inherent in the described encoding scheme.

While the preferred embodiments of the invention have been illustrated and described, variations will be apparent to those skilled in the art. Accordingly, the invention is not limited to the described embodiments, and the scope of the invention should be determined by reference to the following claims.

The embodiments of the invention in which an exclusive property or privilege is claimed are defined as follows:

1. A method of performing a primitive data processing operation in which first and second input signals are combined to produce an output signal, the method comprising:
   generating a conversion signal representing a pseudorandom sequence of numbers;
   using the conversion signal to convert the first input signal into a first stochastic signal and to convert the second input signal into a second stochastic signal; and
   performing a primitive data processing operation on the first and second stochastic signals to produce the output signal, wherein the primitive data processing operation comprises a maximum operation wherein the output signal corresponds to the larger of the two input signals, and wherein the maximum operation is carried out by performing a nonexclusive OR operation on the first and second stochastic input signals to produce the output signal.

2. A method of performing a primitive data processing operation in which first and second input signals are combined to produce an output signal, the method comprising:
   generating a conversion signal representing a pseudorandom sequence of numbers;
   using the conversion signal to convert the first input signal into a first stochastic signal and to convert the second input signal into a second stochastic signal; and
   performing a primitive data processing operation on the first and second stochastic signals to produce the output signal, wherein the primitive data processing operation comprises a minimum operation wherein the output signal corresponds to the smaller of the two input signals, and wherein the minimum operation is carried out by performing an AND operation on the first and second stochastic input signals to produce the output signals.

3. A method of performing a primitive data processing operation in which first and second input signals are combined to produce an output signal, the method comprising:
   generating a conversion signal representing a pseudorandom sequence of numbers;
   using the conversion signal to convert the first input signal into a first stochastic signal and to convert the second input signal into a second stochastic signal; and
   performing a primitive data processing operation on the first and second stochastic signals to produce the output signal, wherein the primitive data processing operation comprises an absolute difference operation wherein the output signal corresponds to the absolute value of the difference between the two input signals, and wherein the absolute difference operation is carried out by performing an exclusive XOR operation on the first and second stochastic input signals to produce the output signal.

4. A method of performing a primitive data processing operation in which first and second input signals are combined to produce an output signal, the method comprising:
   generating a conversion signal representing a pseudorandom sequence of numbers;
   using the conversion signal to convert the first input signal into a first stochastic signal and to convert the second input signal into a second stochastic signal; and
   performing a primitive data processing operation on the first and second stochastic signals to produce the output signal, wherein the primitive data processing operation comprises a mean operation wherein the output signal corresponds to the arithmetic mean of the two input signals, and wherein the mean operation is carried out by switching between the two stochastic input signals to produce the output signal.

5. An apparatus for performing a primitive data processing operation in which first and second input signals are combined to produce an output signal, the apparatus comprising:
   means for generating a conversion signal representing a pseudorandom sequence of numbers;
   first encoder means for using the conversion signal to convert the first input signal into a first stochastic signal;

second encoder means for using the conversion signal to convert the second input signal into a second stochastic signal; and logic means for performing a primitive data processing operation on the first and second stochastic signals to produce the output signal, wherein the primitive data processing operation comprises a maximum operation wherein the output signal corresponds to the larger of the two input signals, and wherein the logic means for performing the maximum operation comprises a nonexclusive OR gate.

6. An apparatus for performing a primitive data processing operation in which first and second input signals are combined to produce an output signal, the apparatus comprising:

means for generating a conversion signal representing a pseudorandom sequence of numbers;

first encoder means for using the conversion signal to convert the first input signal into a first stochastic signal;

second encoder means for using the conversion signal to convert the second input signal into a second stochastic signal; and logic means for performing a primitive data processing operation on the first and second stochastic signals to produce the output signal, wherein the primitive data processing operation comprises a minimum operation wherein the output signal corresponds to the smaller of the two input signals, and wherein the logic means for performing the maximum operation comprises an AND gate.

7. An apparatus for performing a primitive data processing operation in which first and second input signals are combined to produce an output signal, the apparatus comprising:

means for generating a conversion signal representing a pseudorandom sequence of numbers;

first encoder means for using the conversion signal to convert the first input signal into a first stochastic signal;

second encoder means for using the conversion signal to convert the second input signal into a second stochastic signal; and logic means for performing a primitive data processing operation on the first and second stochastic signals to produce the output signal, wherein the primitive data processing operation comprises an absolute different operation wherein the output signal corresponds to the absolute value of the difference between the two input signals, and wherein the logic means for performing the absolute difference operation comprises a nonexclusive XOR gate.

8. An apparatus for performing a primitive data processing operation in which first and second input signals are combined to produce an output signal, the apparatus comprising:

means for generating a conversion signal representing a pseudorandom sequence of numbers;

first encoder means for using the conversion signal to convert the first input signal into a first stochastic signal;

second encoder means for using the conversion signal to convert the second input signal into a second stochastic signal; and logic means for performing a primitive data processing operation on the first and second stochastic signals to produce the output signal, wherein the primitive data processing operation comprises a mean operation wherein the output signal corresponds to the arithmetic of the two input signals, and wherein the logic means for carrying out the mean operation comprises a switch.

* * * * *